United States Patent [19]

Maeda et al.

[11] Patent Number: 5,330,577
[45] Date of Patent: Jul. 19, 1994

[54] SEMICONDUCTOR FABRICATION EQUIPMENT

[75] Inventors: Kazuo Maeda; Kouichi Ohira; Mitsuo Hirose, all of Tokyo, Japan

[73] Assignees: Semiconductor Process Laboratory Co., Inc.; Canon Sales Co., Inc.; Alcan-Tech Co., Inc., all of Japan

[21] Appl. No.: 934,759
[22] PCT Filed: Feb. 12, 1992
[86] PCT No.: PCT/JP92/00136
§ 371 Date: Oct. 27, 1992
§ 102(e) Date: Oct. 27, 1992
[87] PCT Pub. No.: WO92/15115
PCT Pub. Date: Sep. 3, 1992
[51] Int. Cl.$^5$ .............................................. C23C 16/00
[52] U.S. Cl. ........................................ 118/722; 134/21; 148/DIG. 17; 239/106; 239/114; 239/115
[58] Field of Search .................... 118/722; 134/21; 148/DIG. 17; 239/106-118

[56] References Cited

U.S. PATENT DOCUMENTS

| | | | |
|---|---|---|---|
| 4,362,572 | 12/1982 | Wallace | 239/106 |
| 4,711,256 | 12/1987 | Kaiser | 148/DIG. 17 |
| 4,792,363 | 12/1988 | Franklin | 134/21 |
| 4,814,794 | 3/1989 | Sato | 239/112 |
| 4,819,676 | 4/1989 | Blehert et al. | 134/21 |
| 4,867,870 | 9/1989 | Kettlety et al. | 239/116 |
| 4,964,921 | 10/1991 | Lloyd | 134/21 |

FOREIGN PATENT DOCUMENTS 4137613 5/1992 Japan.
4145623 5/1992 Japan.
4180226 6/1992 Japan.

Primary Examiner—R. Bruce Breneman
Assistant Examiner—Ramamohan Rao Paladugu
Attorney, Agent, or Firm—Lorusso & Loud

[57] ABSTRACT

A semiconductor fabrication apparatus for forming a film on a wafer by a CVD method provides for easy removal of the dust generated in a film-forming chamber without reducing the uptime/downtime ratio of the equipment. The apparatus includes one or more gas dispersing devices having gas releasing surfaces for releasing a reaction gas to form a film on a wafer; one or more wafer holders having wafer mounting surfaces opposed to the plane defined by the gas releasing surface; and one or more cleaners, each having a suction port and a brush connected to the suction port, provided opposing the gas releasing surface. Either the cleaner or the gas dispersing device is moved so that the brush contacts and traverses the gas releasing surface.

11 Claims, 6 Drawing Sheets

SEMICONDUCTOR FABRICATION EQUIPMENT

TECHNICAL FIELD

The present invention relates to a semiconductor fabrication apparatus for forming a film on a wafer by a CVD method.

BACKGROUND ART

In a conventional CVD system, a film is formed on a wafer utilizing a chemical reaction with a reaction gas. Accordingly, by-product particles form on the gas releasing surface of the gas dispersing device, and further these particles separate from the gas releasing surface and then stick to the wafer, thereby causing contamination of the wafer. Therefore, in the CVD system, it is necessary to clean the gas releasing surface of the gas dispersing device on a specified cycle.

In a plasma CVD system, even if by-product particles stick to the gas releasing surface of a gas dispersing device, the inside of a chamber can be depressurized and thereby the particles stuck on the gas releasing surface can be simply removed by introducing an etching gas into the chamber after the formation of a film. This technique, which is called an in-situ cleaning, is conventional practice.

In an atmospheric pressure CVD system, when a reaction gas such as a mixed gas of $SiH_4$—$O_2$ or TEOS—$O_3$ is released from a gas releasing device, the reaction products stick to the gas releasing surface as powder-like particles. However, in this CVD system, since the inside of the chamber cannot be depressurized, it is impossible to perform the in-situ cleaning, and it thereby differs from the above plasma CVD system. Accordingly, the particles on the gas releasing surface must be physically removed by a cleaner or chemically removed by chemicals such as hydrofluoric acid (HF) after stopping this CVD system.

As a result, in the atmospheric pressure CVD system, the cleaning takes a lot of time or labor thereby reducing the uptime/downtime ratio thereof. Also, in this system, the deposited powder can accummulate to the point where it is difficult to remove.

Taking the above conventional problems into consideration, the present invention has been made, and an object is to provide a semiconductor fabrication apparatus and method using the same, wherein the dust generated in a chamber can be easily removed without reducing the uptime/downtime ratio of the equipment.

DISCLOSURE OF THE INVENTION

In a first aspect of the present invention, there is provided a semiconductor fabrication apparatus including: one or more gas dispersing devices, each being adapted to release a reaction gas from a gas releasing surface for forming a film on a wafer; one or more wafer holders having wafer mounting surfaces, each being parallel to the plane including the gas releasing surface; and one or more cleaners, each having a suction port and brush connected to the suction port and defining a plane parallel to the plane including the gas releasing surface, wherein either the cleaner or the gas dispersing device is moved to cause the brush to contact and traverse the gas releasing surface. This makes it possible to brush, at least either before or after the film formation, the gas releasing surface with the brush and simultaneously the dust separated from the gas releasing surface is removed through a suction port, and therefore, the dust remaining in a chamber can be reduced.

In a second aspect of the present invention, there is provided a semiconductor fabrication apparatus according to the first aspect, further including a rotary shaft, wherein the wafer holders are mounted around the circumference of the rotary shaft and fixed to the rotary shaft. Each of the gas dispersing devices is arranged such that the gas releasing surface is opposed to the wafer mounting surface. The wafer holder and the cleaner rotate with the rotary shaft along a circular planar path opposed to the gas releasing surface. With this construction, since the wafer holder and the cleaner are moved along a so-called endless track (the planar, circular path), it is possible to provide a continuous automatic film formation system such as a CVD system.

In a third aspect of the present invention, there is provided a semiconductor fabrication apparatus according to the first aspect of the present invention, further including a rotary shaft, wherein the gas dispersing devices are mounted around the circumference of the rotary shaft and fixed to the rotary shaft, with each of the wafer holders having its wafer mounting surface opposed to the gas releasing surface. The gas dispersing devices rotate with the rotary shaft along a planar path opposed to the wafer holders and the cleaners. With this construction, since the gas dispersing device is moved along a so-called endless track (planar path), it is possible to provide a continuous automatic film formation system such as a CVD system.

In a fourth aspect of the present invention, the above cleaners are integrally provided on opposite sides of at least one of the wafer holders.

In a fifth aspect of the present invention, the above cleaners are fixed on the rotating shaft separately from the wafer holders, positioned between at least one pair of adjacent wafer holders.

With this construction, either before or after the film formation, the cleaning is frequently carried out by movement of either the gas dispersing device or the wafer holder, and consequently, it is possible to secure higher cleanliness in the chamber. Also, since the dust generated in the chamber can be easily removed without opening the chamber, it is possible to eliminate the necessity of stopping the equipment as required for conventional apparatus and hence to prevent the lowering the uptime/downtime ratio of the equipment.

BEST MODE FOR CARRYING OUT THE INVENTION

The present invention will be described in detail with reference to the accompanying drawings.

Figure 1:
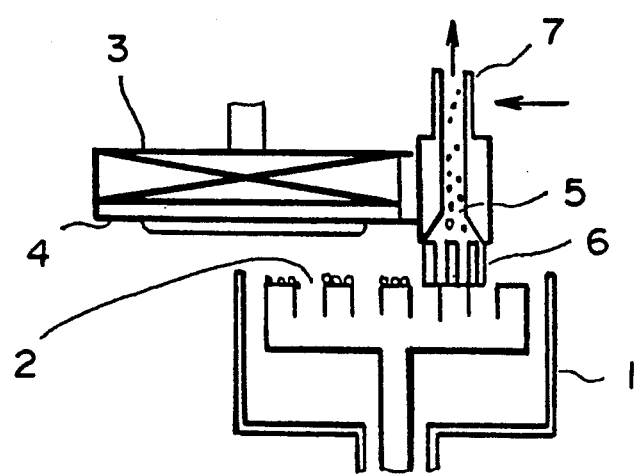
FIG. 1 is a schematic view showing a semiconductor fabrication apparatus according to the present invention.
Figure 2:
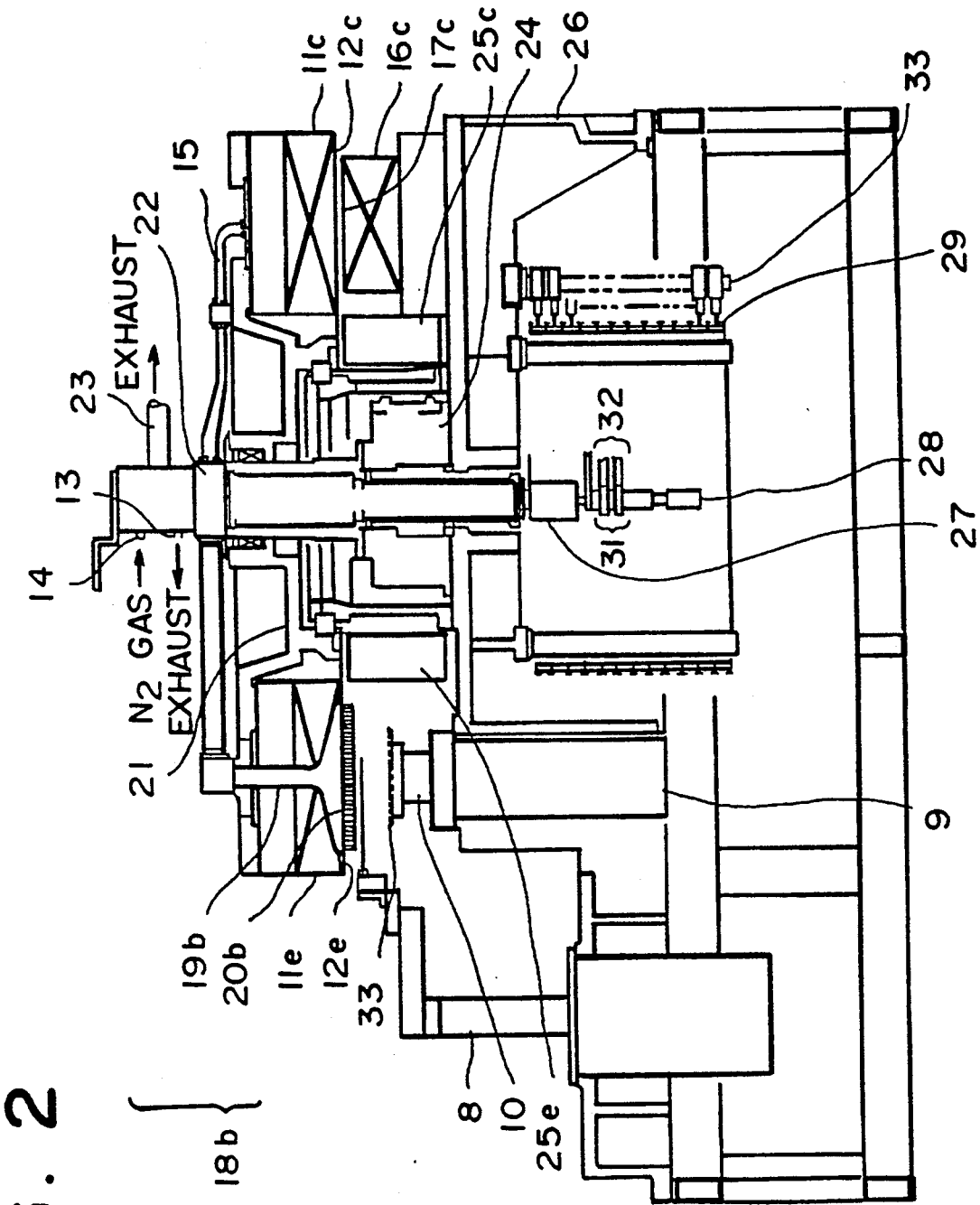
FIG. 2 is an elevational view of an embodiment of a CVD system according to the present invention.
Figure 3:
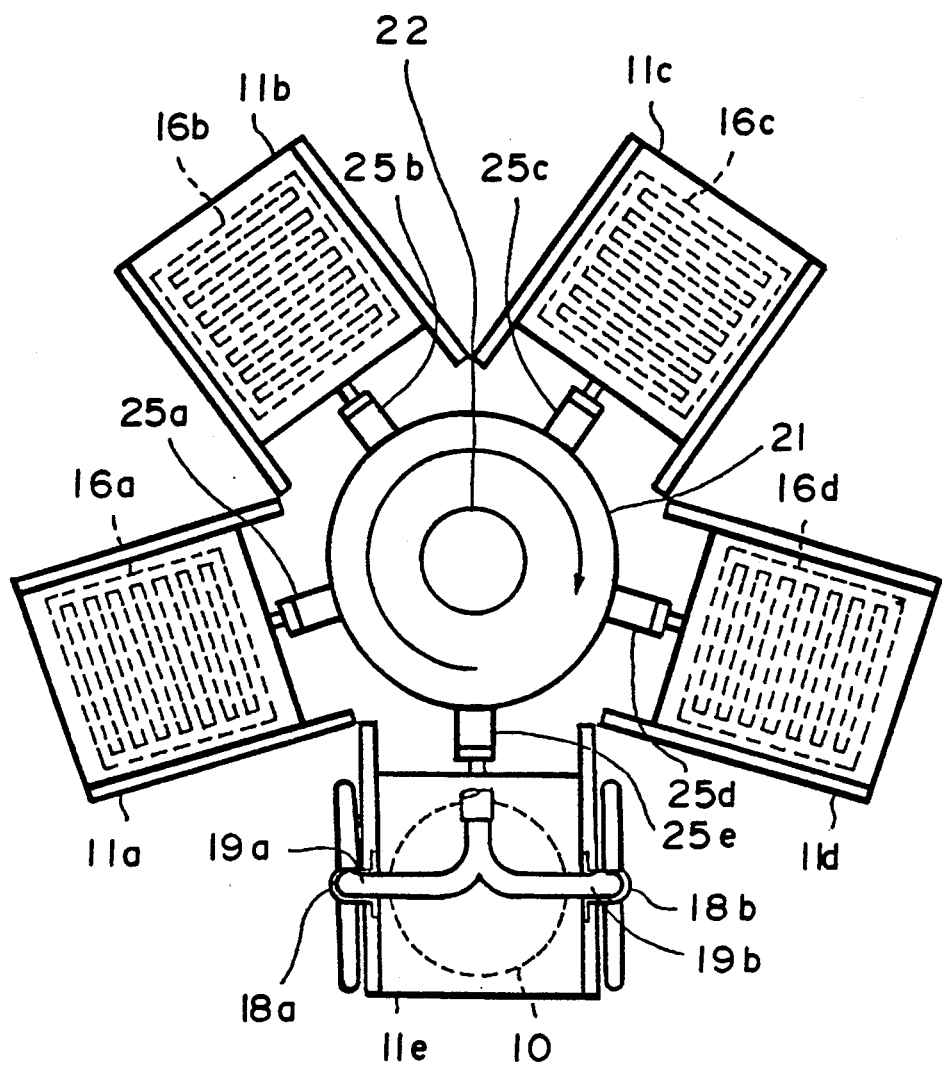
FIG. 3 is a plan view showing the details of wafer holders and gas dispersing devices in the CVD system of FIG. 2.
Figure 4:
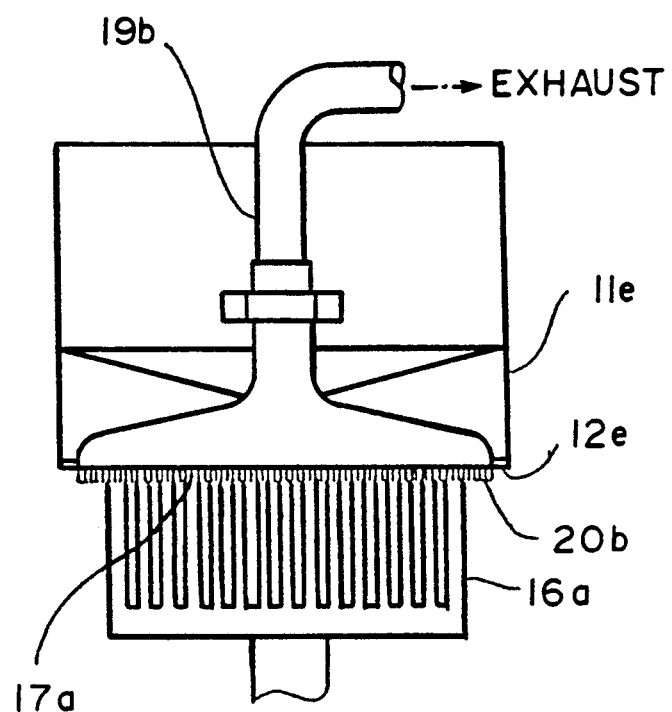
FIG. 4 is an elevational view showing the details of cleaners in the CVD system of the FIG. 2.

FIGS. 2, 3 and 4 are views explaining a CVD system in accordance with an embodiment of the present invention.

In FIGS. 2, 3 and 4: numeral 8 indicates a robot for transferring wafers to or from a loader/unloader unit 9 of a semiconductor fabrication equipment; 10 is an elevator pedestal provided on the loader/unloader unit 9 of the semiconductor fabrication equipment and is vertically movable for mounting or removing the transferred wafers onto or from wafer mounting surfaces 12a to 12e of the wafer holders 11a to 11e.

Numerals 11a to 11e indicate respective wafer holders for holding the wafers during forming films on the surfaces of the wafers, and more specifically, for fixing or removing the wafers onto or from the wafer mounting surfaces 12a to 12e by a chuck fluidly connected to an exhaust port 13, in turn connected to an exhauster or a nitrogen gas introducing port 14 through a pipe-like arm 15. Also, as shown in FIG. 3, the wafer holders 11a to 11e are provided around a rotary shaft 22. They are fixed to the rotary shaft 22 through the arm 15 and a turntable 21 for rotation with the rotary shaft 22. Further, 16a to 16d are gas dispersing devices for feeding a reaction gas to the wafers, which are respectively provided with gas releasing surfaces 17a to 17d opposing the wafer mounting surfaces 12a to 12e. Numerals 18a and 18b denote cleaners, which are respectively formed on opposite sides of the wafer holder 11e, integral with the wafer holder 11e. As shown in FIG. 4, each of the cleaners 18a and 18b includes brushes 20a and 20b respectively provided on the leading edges of the suction ducts (suction ports) 19a and 19b so as to be brought in contact with the gas releasing surfaces 17a to 17d of the gas dispersing devices 16a to 16d. The cleaners 18a and 18b are moved so that the brushes 20a and 20b move along the plane including the gas releasing surfaces 17a to 17d, thereby brushing the gas releasing surfaces 17a to 17d. At the same time, the dust separated from the gas releasing surfaces 17a to 17d is removed through a suction duct 19. Further, the suction duct 19 is fluidly connected to an exhaust port 23 connected to an exhauster (not shown).

Numeral 22 indicates a rotary shaft, which is integral with the wafer holders 11a to 11e and is rotated such that the wafer mounting surfaces 12a to 12e rotate in one plane; 24 is a motor such as a direct drive motor for turning the wafer holders 11a to 11e; 25a to 25e are oscillation units for linearly reciprocating the wafer holders 11a to 11e in the specified directions with the held positions as base points, respectively; 26 is a box-like base for supporting the gas dispersing devices 16a to 16d around its circumference and for rotatably supporting the rotary shaft 22; 27 is a slip ring for transmitting a signal to control a solenoid valve provided at one end of the rotary shaft 22, wherein a rotary connector is used as an electric contact for preventing rotation of the rotary shaft 22; 28 is a slip ring, for outputting a signal from a thermocouple by contacting a contact 32 to prevent the rotation of the rotary shaft 22; 29 is a slip ring connected to the contact 32; 30 is a collector having one end in contact with the slip ring 29 and the other end connected to an electric power supply (not shown) for supplying d.c. or a.c. power to heaters buried in the wafer holders 11a to 11e.

In the above-described CVD system of the present invention, the cleaners 18a and 18b having the brushes 20a and 20b and the suction ducts 19a and 19b are moved while held opposed to the plane including the gas releasing surfaces 17a to 17d of the gas dispersing devices 16a to 16d. Thus, the brushes 20a and 20b are set to be brought into contact with the gas releasing surfaces 17a to 17d. Consequently, in transferring the wafer holder 11e, before or after the film formation, the brushes 20a and 20b physically rub the gas releasing surfaces 17a to 17d, and simultaneously the dust separated from the gas releasing surfaces 17a to 17d by the brushing is removed by vacuum through the suction ports 19a and 19b. Therefore, it is possible to reduce the dust remaining in the chamber.

Further, since the cleaners 18a and 18b are positioned on both sides of the wafer holder 11e, the cleaning can be carried out in transferring the wafer holder 11e before or after the film formation. Accordingly, the dust generated in the chamber can be easily removed without opening the chamber. This makes it possible to eliminate the necessity of stopping the CVD system and hence prevents the lowering of the uptime/downtime ratio thereof.

Further, since the cleaning can be frequently carried out in transferring the wafer holder 11e, it is possible to secure a high degree of cleanliness in the chamber.

Also, since the wafer holders 11a to 11e and the cleaners 18a and 18b are turned while fixed to the rotating shaft, they move along a so-called endless track, and therefore, it is possible to provide a continuous automatic film formation apparatus such as a CVD system.

In this embodiment, the cleaners 18a and 18b are respectively provided at both sides of the wafer holder 11e; however, only one cleaner need be provided at one side. Also, the cleaners 18a and 19b are provided on only one wafer holder 11e; however, they may be provided on all of the wafer holders 11a to 11e.

Further, this embodiment forms the film with the exposed surface of the wafer facing downwardly; however, the invention is also applicable to film formation with the wafer facing upwardly.

Also, in the illustrated embodiment the cleaners 18a and 18b are integrally formed on the wafer holder 11e; however, they may be separate from the wafer holder 11e, and independently fixed on the rotating shaft 22 so as to be positioned, for example, between the wafer holders 11e and 11a, or between the wafer holders 11e and 11d.

Further, although the wafer holders 11a and 11e and the cleaners 18a and 18b are shown as being movable, if necessary, they may be fixed and the gas dispersing devices 16a and 16d may be moved.

A method for forming a single insulating film on a wafer using a CVD system as shown in FIGS. 2, 3 and 4 will now be explained with reference to FIGS. 2 to 6. In this example, a specified thickness of a CVD $SiO_2$ film is formed in one turn of a wafer holder around a rotating shaft.

As shown in FIG. 2, a first wafer is transferred from a cassette station to a loader/unloader station 9 by a robot 8, and is then mounted on an elevator pedestal 10.

The pedestal 10 is lifted, and the first wafer 33 is mounted on a wafer holder 11e and held there by evacuation through an exhaust port 13. A slip ring 27 corresponding to the chuck of the wafer holder 11e receives a signal to open a solenoid valve, thus initiating evacutaion through port 13 to fix the first wafer on wafer mounting surface 12e. At this time, heaters of all wafer holders 11a to 11e receive electric power through a slip ring 31, contact 32, slip ring 29 and collector 30, so that wafer mounting surfaces 12a to 12e of the wafer holders 11a to 11e are kept at approximately 350° C.

Figure 5A:
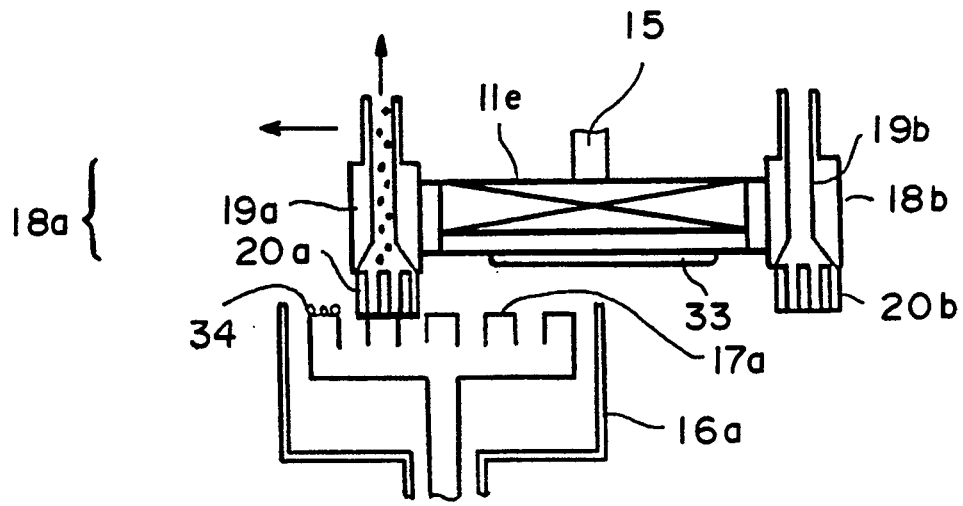
FIGS. 5a and 5b are cross-sectional views illustrating operation of a CVD system according to the present invention.

After the first wafer 33 is heated to approximately 350° C., the rotary shaft 22 is rotated so as to move the wafer holder 11e to a position directly over the gas dispersing device 16a. At this time, as shown in FIG. 5a, the brush 20a of the cleaner 18a brushes the gas releasing surface 17a of the gas dispersing device 16a thereby separating the dust 34 adhering to the gas releasing surface 17a from the previous reaction, evacuating the separated dust 34 through duct 19a connected to the brush 20a, and removing the dust 34 to the exterior of the system by way of the exhaust port as shown in FIG. 2.

Figure 5B:
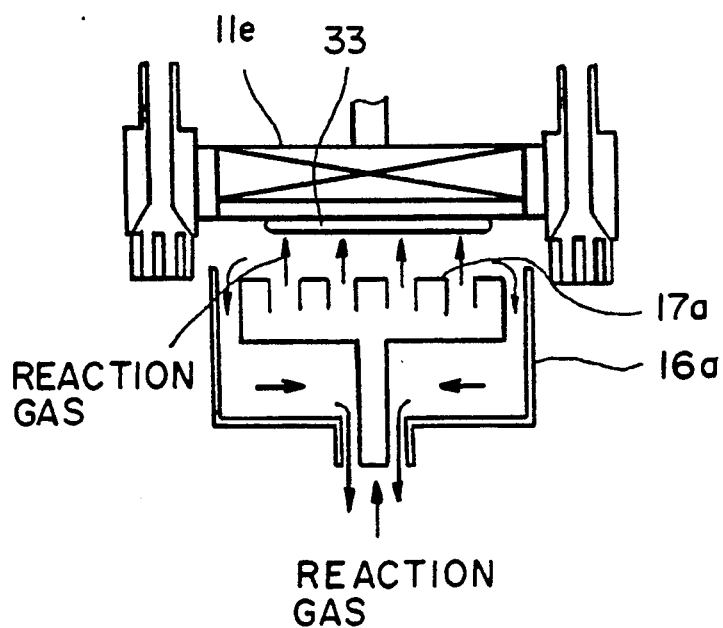
Figure 6:
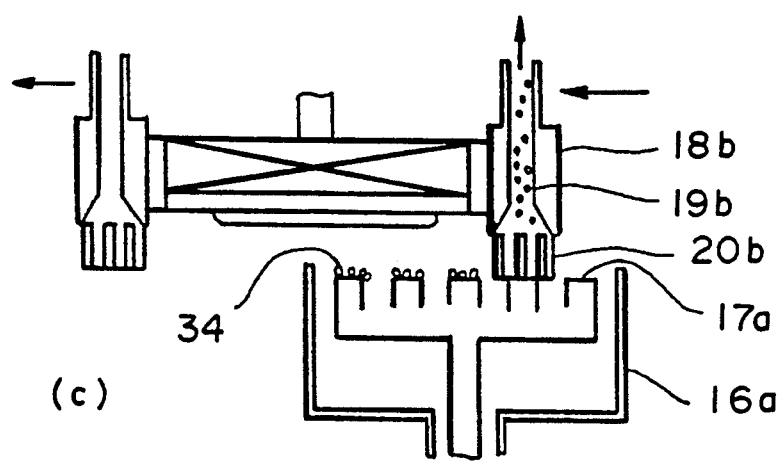
FIG. 6 is another cross-sectional view explaining operation of the CVD system of the present invention.

As shown in FIG. 5b, the wafer holder 11e is stopped at the position directly over the gas dispersing device 16a, and simultaneously the mixed reaction gas of TEOS-$O_3$ is released from the gas releasing surface 17a of the gas dispersing device 16a. At this time, while the depositing rate of the $SiO_2$ film is adjusted to a value of approximately 2000 Å/min, the above state is held for approximately 1 min., so that the $SiO_2$ film is formed on the first wafer 33 to a thickness of approximately 2000 Å which is approximately 1/5 the target thickness. The $SiO_2$ film thus obtained is of good quality without any defect, because the dust 34 on the gas releasing surface 17a is removed, and the surface of the wafer 33 is thereby kept clean during the film formation. Further, during the film formation, the wafer holder 11e is linearly reciprocated in the radial direction with the held position taken as a base point by the oscillating unit 25e, so that the supply of the reaction gas is equalized over the surface of the wafer to form a $SiO_2$ film of uniform thickness and quality. At the same time, the second wafer is mounted on the wafer holder 11d positioned on the loader/unloader 9 in the same manner as described above and heated to approximately 350° C.

Then, in order to move the wafer holders 11e and 11d to positions directly over the gas dispersing devices 16a and 16b, the rotary shaft 22 is rotated. As shown in FIG. 5c, the brush 20b of the cleaner 18b brushes the gas releasing surface 17a of the gas dispersing device 16a thereby separating the dust 34 remaining from the previous reaction, removing the separated dust 34 through the suction duct 19b connected to the brush 20b to the exterior of the system by way of the exhaust port 23 as shown in FIG. 2. Accordingly, it is possible to provide the desired quality of $SiO_2$ film on the next wafer.

The rotary shaft 22 is further rotated and stopped with the wafer holders 11e and 11d at positions directly over the gas dispersing devices 16a and 16b. At this time, since the second wafer is already heated to approximately 350° C., the film formation can be immediately started. Accordingly, the mixed reaction gas of TEOS—$O_3$ is released from the gas dispersing devices 16a and 16b. By keeping the above state for approximately 1 min, the $SiO_2$ film is formed on the first wafer 33 to a thickness of approximately 4000 Å which is approximately 2/5 the target thickness, and the $SiO_2$ film is formed on the second wafer 33 to a thickness of approximately 2000 Å which is approximately 1/5 the target thickness.

Thus, the wafers are sequentially set on the wafer holders 11c, 11b and 11a, and the $SiO_2$ films are respectively formed on the wafers. When being returned to the loader/unloader section 9 after one turn around the rotary shaft 22, the first wafer 33 carries a $SiO_2$ film having the target thickness.

The elevator pedestal 10 is then lifted, and the skip ring 27 corresponding to the chuck for the wafer mounting surface 12e of the wafer holder 11e receives a signal to close the solenoid valve of the exhaust port 13 and to open the solenoid valve of the introducing port 14 for supplying nitrogen gas to the chuck. Thus, the first wafer 33 is removed from the wafer mounting surface and placed on the elevator pedestal 10. Then, the first wafer 33 is transferred to the cassette station by the robot 8. Thus, the wafers carrying a $SiO_2$ film of the target thickness are sequentially received at the cassette station.

As mentioned above, in the method for forming the $SiO_2$ film according to this illustration, since the brushes 20a and 20b physically rub the gas releasing surface 17a before or after the film formation, and simultaneously the dust separated from the gas releasing surface 17a by the above brushing is removed through the suction ducts 19a and 19b, it is possible to reduce the remaining dust in the chamber.

Also, since the cleaning is carried out at the time of moving the wafer holder 11e before or after the film formation, it is possible to easily remove the dust generated in the chamber without opening the chamber. This eliminates the necessity of stopping the system, which makes it possible to prevent the lowering of the uptime/downtime ratio of the system as compared with the conventional method. Further, since the cleaning can be frequently carried out at the time of moving the wafer holder 11e, it is possible to maintain a high degree of cleanliness in the chamber.

Further, the wafer holders 11e and cleaners 18a and 18b are fixed on the rotary shaft 22 and rotate therewith, so that it is possible to continuously form a $SiO_2$ film or the like and hence to improve the throughput.

In addition, in the foregoing illustration the cleaning is carried out only twice before and after the film formation in one turn of the rotary shaft 22, which seems to be sufficient for practical use; however, if necessary, by providing cleaners at the sides of the other wafer holders and performing multiple cleanings during one turn of the rotary shaft, it is possible to provide the inside the chamber a higher degree of cleanliness.

We claim:

1. A semiconductor fabrication apparatus comprising:
    wafer holding means for holding a wafer on a wafer mounting surface;
    at least one gas dispersing device having a gas releasing surface adapted to release a reaction gas for forming a film on the wafer;
    at least one cleaner, fixed to said wafer holder means, having a suction port and a brush connected to said suction port; and
    means for moving said cleaner or said gas dispersing device so that said brush contacts and traverses said gas releasing surface.

2. A semiconductor fabrication apparatus according to claim 1, further comprising:
    a rotary shaft and a plurality of said wafer holder means fixed to said rotary shaft around its circumference, whereby said plurality of wafer holder means rotate in a plane parallel to a plane defined by said gas releasing surface.

3. A semiconductor fabrication apparatus according to claim 1, further comprising:
a rotary shaft and a plurality of said gas dispersing devices fixed to said rotary shaft around its circumference, whereby said plurality of gas dispersing devices rotate in a plane parallel to a plane defined by said wafer mounting surface.

4. A semiconductor fabrication apparatus according to claim 1, wherein two of said cleaners are mounted on opposite sides of said wafer holder means.

5. A semiconductor fabrication apparatus according to claim 2 wherein said cleaner is mounted fixed to said rotary shaft, separate from said wafer holders, and is positioned between at least one pair of adjacent wafer holder means.

6. A semiconductor fabrication apparatus comprising:
a plurality of wafer holders for holding wafers arranged in a first planar array around an axis;
a plurality of gas dispersing devices, each gas dispersing having a gas releasing surface adapted to release a reaction gas for forming a film on the wafer, said plurality of gas dispersing devices being arranged in a second planar array around said axis parallel to said first planar array;
at least one cleaner, fixed to at least one of said wafer holders, having a suction port and a brush connected to said suction port; and
means for rotating one of said planar arrays relative to the other so that said brush contacts and traverses said gas releasing surfaces.

7. A semiconductor fabrication apparatus according to claim 6 wherein said axis is defined by a rotary shaft to which said plurality of wafer holders are fixed around its circumference and wherein said rotating means rotatably drives said rotary shaft.

8. A semiconductor fabrication apparatus according to claim 6 wherein said axis is defined by a rotary shaft to which said plurality of gas dispersing devices are fixed around its circumference and wherein said rotating means rotatably drives said rotary shaft.

9. A semiconductor fabrication apparatus according to claim 6 wherein two of said cleaners are mounted on opposite sides of at least one of said wafer holders.

10. A semiconductor fabrication apparatus according to claim 6 comprising a plurality of pairs of said cleaners, each pair of said cleaners being mounted on opposing sides of one of said wafer holders.

11. A semiconductor apparatus according to claim 6 wherein said one cleaner is mounted fixed to said rotary shaft, separate from said wafer holders, in a position between at least one pair of adjacent wafer holders.

* * * * *

UNITED STATES PATENT AND TRADEMARK OFFICE
CERTIFICATE OF CORRECTION

PATENT NO. : 5,330,577
DATED : July 19, 1994
INVENTOR(S) : MAEDA et al

It is certified that error appears in the above-indentified patent and that said Letters Patent is hereby corrected as shown below:

Col. 6, line 49, delete "the", second instance;

line 53, delete "holding" (1st occurrence) insert --holder--.

Col. 8, line 4, before "means" insert --rotating--.

Signed and Sealed this

Eighteenth Day of April, 1995

Attest:

BRUCE LEHMAN

Commissioner of Patents and Trademarks

Attesting Officer